(12) United States Patent
Hsu et al.

(10) Patent No.: US 12,717,999 B1
(45) Date of Patent: Aug. 25, 2026

(54) DYNAMIC ORDERING OF DESIGN RULE CHECKS

(71) Applicant: Synopsys, Inc., Sunnyvale, CA (US)

(72) Inventors: Chin-Hsiung Hsu, Taipei (TW); Sheng-Wei Yang, Hsinchu (TW); Chau-Chin Huang, Hsinchu (TW); Yu-Hsiang Cheng, Hsinchu (TW); Guo-Ting Wang, Hsinchu (TW); James Yu, Taipei (TW); Philip Hui-Yuh Tai, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 668 days.

(21) Appl. No.: 18/211,864

(22) Filed: Jun. 20, 2023

(51) Int. Cl.

| | |
|---|---|
| ***G06F 30/398*** | (2020.01) |
| ***G06F 30/27*** | (2020.01) |
| ***G06F 30/3308*** | (2020.01) |
| ***G06F 30/367*** | (2020.01) |
| ***G06N 3/0464*** | (2023.01) |
| ***G06N 3/08*** | (2023.01) |

(Continued)

(52) U.S. Cl.
CPC ............ *G06F 30/398* (2020.01); *G06F 30/27* (2020.01); *G06F 30/3308* (2020.01); *G06F 30/367* (2020.01); *G06N 3/0464* (2023.01); *G06N 3/08* (2013.01); *G06N 7/06* (2013.01); *G06N 20/00* (2019.01)

(58) Field of Classification Search
CPC .. G06F 30/398; G06F 30/3308; G06F 30/367; G06F 30/27; G06N 3/0464; G06N 3/08; G06N 7/06; G06N 20/00
USPC ....... 716/112, 106, 136; 703/14; 706/12, 25, 706/46
See application file for complete search history.

(56) References Cited

U.S. PATENT DOCUMENTS 5,844,818 A * 12/1998 Kochpatcharin ....... G06F 30/33 716/106
6,397,373 B1 * 5/2002 Tseng .................... G06F 30/398 716/139

(Continued)

FOREIGN PATENT DOCUMENTS

CN 102346800 B * 6/2013
CN 112668271 A * 4/2021 ........... G06F 30/392

OTHER PUBLICATIONS

Ding et al., "Machine Learning based Lithographic Hotspot Detection with Critical-Feature Extraction and Classification", IEEE, 2009, 4 pages. (Year: 2009).*

(Continued)

*Primary Examiner* — Phallaka Kik
(74) *Attorney, Agent, or Firm* — WOMBLE BOND DICKINSON (US) LLP

(57) ABSTRACT

A method includes: receiving an integrated circuit design including a plurality of cells; performing a first plurality of design rule checks on a first portion of the plurality of cells of the integrated circuit design based on a sequence of design rule checkers arranged in a first order; collecting data on an execution of the design rule checkers on the first portion of the plurality of cells; updating, by a processing device, the sequence of design rule checkers, based on the data, to a second order of design rule checkers; and performing a second plurality of design rule checks on a second portion of the plurality of cells of the integrated circuit design based on the sequence of design rule checkers arranged in the second order.

20 Claims, 9 Drawing Sheets

(51) Int. Cl.
*G06N 7/06* (2006.01)
*G06N 20/00* (2019.01)

(56) References Cited

U.S. PATENT DOCUMENTS 6,606,735 B1 * 8/2003 Richardson ........... G06F 30/398 716/112
6,611,946 B1 * 8/2003 Richardson ........... G06F 30/398 716/112
7,149,989 B2 * 12/2006 Lakshmanan ......... G06F 30/398 716/112
8,040,358 B2 * 10/2011 Jungreis .................. G06F 30/13 715/965
11,042,806 B1 * 6/2021 Jiang ..................... G06F 30/398
2009/0158223 A1 * 6/2009 Gray ....................... G06F 30/39 716/132
2012/0144349 A1 * 6/2012 Dai ....................... G06F 30/398 716/52
2015/0286770 A1 * 10/2015 Morishita ............ H05K 1/0225 716/112
2016/0125120 A1 * 5/2016 Yu ......................... G06F 30/398 716/52
2016/0162628 A1 * 6/2016 Aggarwal ............. G06F 30/398 716/52
2016/0378906 A1 * 12/2016 Yuan ..................... G06F 30/398 716/52
2021/0374320 A1 * 12/2021 Wang .................... G06F 30/398
2022/0335197 A1 * 10/2022 Hsu ....................... G06F 30/392
2023/0138706 A1 * 5/2023 Apte ..................... G06F 30/398 716/112
2023/0205968 A1 * 6/2023 Kahng ................ G06F 30/3947 716/129

OTHER PUBLICATIONS

Ding et al., "High Performance Lithographic Hotspot Detection using Hierarchically Refine Mahcine Learning", IEEE, 2011, pp. 775-780. (Year: 2011).*
Alam et al., "DRDebug: Automated Design Rule Debugging", IEEE Transactions on Computer-Aided Design of Integrated Circuits and Systems, vol. 42, No. 2, Feb. 2023, pp. 606-615. (Year: 2023).*
Goncalves et al., "SmartDR: Algorithms and Techniques for Fast Detailed Routing with Good Design Rule Handling", ACM Trans. Des. Auto. Electron. Syst., vol. 26, No. 2, Article 9, Oct. 2020, 15 pages. (Year: 2020).*
Kahng et al., "Fast Dual Graph Based Hotspot Detection", Pro. of SPIE, vol. 6349, 63490H, 2006, 8 pages. (Year: 2006).*
Hossam et al.,"Fast-Track Your Early SoC Design Exploration and Verification", Semiconductor Engineering, Sep. 26, 2019, 17 pages. (Year: 2019).*
Liang, "Machine-Learning Techniques for VLSI Design Automation", Texas A&M University, Dec. 2021, 144 pages. (Year: 2021).*
Yu et al., "Machine-Learning-based hotspot detection using topological classification and critical feature extraction", DAC '13,: The 50th Annual Design Automation Conference, May 29, 2013, 7 pages.. (Year: 2013).*

* cited by examiner

DYNAMIC ORDERING OF DESIGN RULE CHECKS

TECHNICAL FIELD

The present disclosure relates to electronic design automation for integrated circuit designs. In particular, the present disclosure relates to dynamic ordering of design rule checks applied to integrated circuit designs.

BACKGROUND

An integrated circuit or microchip is a set of electronic circuits formed on semiconductor material such as silicon. The integrated circuit is constructed in layers, where semiconductor devices such as transistors are formed in the semiconductor material and layers of metal wiring are formed in patterns on the semiconductor material to connect the semiconductor devices together based on the design of the integrated circuit.

The placement of semiconductor devices within the semiconductor material is subject to physical constraints. For example, transistors corresponding to a logic gate generally do not overlap one another. In addition, limitations of the semiconductor fabrication technology that is targeted for manufacturing an integrated circuit based on a design may impose, for example, minimum distances between circuit elements (e.g., to avoid potential short circuits or electrical crosstalk).

Design rules specify various constraints that are imposed on integrated circuit designs to ensure that the designs can function correctly, reliably, and can be produced with acceptably high yields (e.g., a high percentage of the manufactured devices operate correctly). Design rule checking refers to analyzing the integrated circuit design to ensure that the design rules are satisfied (e.g., there are no violations of design rules) as a part of physical verification prior to approval of the design for fabrication.

SUMMARY

According to one embodiment of the present disclosure, a method includes: receiving an integrated circuit design including a plurality of cells; performing a first plurality of design rule checks on a first portion of the plurality of cells of the integrated circuit design based on a sequence of design rule checkers arranged in a first order; collecting data on an execution of the design rule checkers on the first portion of the plurality of cells; updating, by a processing device, the sequence of design rule checkers, based on the data, to a second order of design rule checkers; and performing a second plurality of design rule checks on a second portion of the plurality of cells of the integrated circuit design based on the sequence of design rule checkers arranged in the second order.

The data may include a failure count for a design rule checker of the design rule checkers, the failure count corresponding to a count of times the design rule checker has reported that a cell has violated a design rule of the design rule checker, and the processing device may compute the second order of design rule checkers based on a failure frequency of the design rule checker, the failure frequency being computed based on the failure count.

The processing device may further compute the second order of design rule checkers based on weighting the failure frequency by a runtime of the design rule checker.

The method may further include: collecting second data on the execution of the design rule checkers on the second portion of the plurality of cells; updating the sequence of design rule checkers, based on the second data, to a third order of design rule checkers; and performing a third plurality of design rule checks on a third potion of the plurality of cells of the integrated circuit design based on the sequence of design rule checkers arranged in the third order.

The plurality of cells of the integrated circuit design may be placed based on a first sub-stage of a physical implementation stage, the method may further include: receiving an updated integrated circuit design including the plurality of cells placed based on a second sub-stage of the physical implementation stage; performing a third plurality of design rule checks on a third portion of the plurality of cells of the updated integrated circuit design based on the sequence of design rule checkers arranged in a third order; collecting second data on the execution of the design rules on the third portion of the plurality of cells; updating the sequence of design rule checkers based on the second data to a fourth order of design rule checkers; and performing a fourth plurality of design rule checks on a fourth portion of the plurality of cells of the updated integrated circuit design based on the sequence of design rule checkers arranged in the fourth order.

The method may further include: classifying the first portion of the plurality of cells of the integrated circuit design using a trained machine learning model, wherein the cells of the first portion of the plurality of cells are classified by the trained machine learning model to a first classification and wherein the first order is associated with the first classification; classifying a third portion of the plurality of cells of the integrated circuit design using the trained machine learning model to a second classification; and performing a third plurality of design rule checks on the third portion of the plurality of cells of the integrated circuit design based on the sequence of design rule checkers arranged in a third order associated with the second classification.

A design rule checker may include a plurality of scenarios arranged in an ordered sequence, and the method may further include: reordering the scenarios of the design rule checker based on a hit rate of a sicario of the scenarios of the design rule checker.

According to one embodiment of the present disclosure, a system includes: a memory storing instructions; and a processor, coupled with the memory and to execute the instructions, the instructions when executed cause the processor to: classify a cell using a machine leaning model based on one or more cell features and one or more environment features of the cell; selecting an order of design rule checkers based on the classification of the cell; and perform design rule checks on the cell based on the selected order of design rule checkers.

The cell features may include one or more of: a size of the cell; a width of the cell; a height of the cell; and a number of pins of the cell.

The environment features may include one or more of: a density of cells in a region containing the cell; a density of connections in the region containing the cell; a density of power and ground rails in the region containing the cell; and blockages with respect to access between pins and metal layers in the region containing the cell.

The processor may further execute the instructions to: collect input training data including cell features and cell environment features; collect training labels including orderings of design rule checkers on corresponding query cells and runtimes of performing design rule checks; and train a machine learning classifier to classify given input cell features and cell environment features to orderings of design rule checkers.

The processor may further execute the instructions to update the order of the design rule checkers based on a failure frequency to compute a second order of the design rule checkers.

The processor may further compute the second order of design rule checkers based on weighting the failure frequency by an average runtime of the design rule checker.

According to one embodiment of the present disclosure, a non-transitory computer-readable medium includes stored instructions, which when executed by a processor, cause the processor to: receive an integrated circuit design including a plurality of cells; perform a first plurality of design rule checks on a first portion of the plurality of cells of the integrated circuit design based on a sequence of design rule checkers arranged in a first order; collect data on the execution of the design rule checkers on the first portion of the plurality of cells; update, by the processor, the sequence of design rule checkers, based on the data, to a second order of design rule checkers different from the first order; and perform a second plurality of design rule checks on a second portion of the plurality of cells of the integrated circuit design based on the sequence of design rule checkers arranged in the second order.

The data may include a failure count for a design rule checker of the design rule checkers, the failure count corresponding to a count of times the design rule checker has reported that a cell has violated a design rule of the design rule checker, and the non-transitory computer-readable medium may further include stored instructions that, when executed by the processor, cause the processor to compute the second order of design rule checkers based on a failure frequency of the design rule checker, the failure frequency being computed based on the failure count.

The non-transitory computer-readable medium may further include stored instructions further stores instructions to computes the second order of design rule checkers based on weighting the failure frequency by an average runtime of the design rule checker.

The non-transitory computer-readable medium may further include stored instructions that, when executed, cause the processor to: collect second data on the execution of the design rule checkers on the second portion of the plurality of cells; update the sequence of design rule checkers, based on the second data, to a third order of design rule checkers different from the first order and different from the second order; and perform a third plurality of design rule checks on a third portion of the plurality of cells of the integrated circuit design based on the sequence of design rule checkers arranged in the third order.

The plurality of cells of the integrated circuit design may be placed based on a first sub-stage of a physical implementation stage, and the non-transitory computer-readable medium including stored instructions may further store instructions that, when executed by the processor, cause the processor to receive an updated integrated circuit design including the plurality of cells placed based on a second sub-stage of the physical implementation stage; perform a third plurality of design rule checks on a third portion of the plurality of cells of the updated integrated circuit design based on the sequence of design rule checkers arranged in a third order; collect second data on the execution of the design rules on the third portion of the plurality of cells; update the sequence of design rule checkers based on the second data to a fourth order of design rule checkers; and perform a fourth plurality of design rule checks on a fourth portion of the plurality of cells of the updated integrated circuit design based on the sequence of design rule checkers arranged in the fourth order.

The non-transitory computer-readable medium including stored instructions may further include instructions that, when executed by the processor, cause the processor to: classifying the first portion of the plurality of cells of the integrated circuit design using a trained machine learning model, wherein the cells of the first portion of the plurality of cells are classified by the trained machine learning model to a first classification and wherein the first order is associated with the first classification; classifying a third portion of the plurality of cells of the integrated circuit design using the trained machine learning model to a second classification different from the first classification; and performing a third plurality of design rule checks on the third portion of the plurality of cells of the integrated circuit design based on the sequence of design rule checkers arranged in a third order associated with the second classification.

A design rule checker may include a plurality of scenarios arranged in an ordered sequence, and the non-transitory computer-readable medium may further include instructions that, when executed by the processor, cause the processor to: reorder the scenarios of the design rule checker based on a hit rate of a sicario of the scenarios of the design rule checker.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
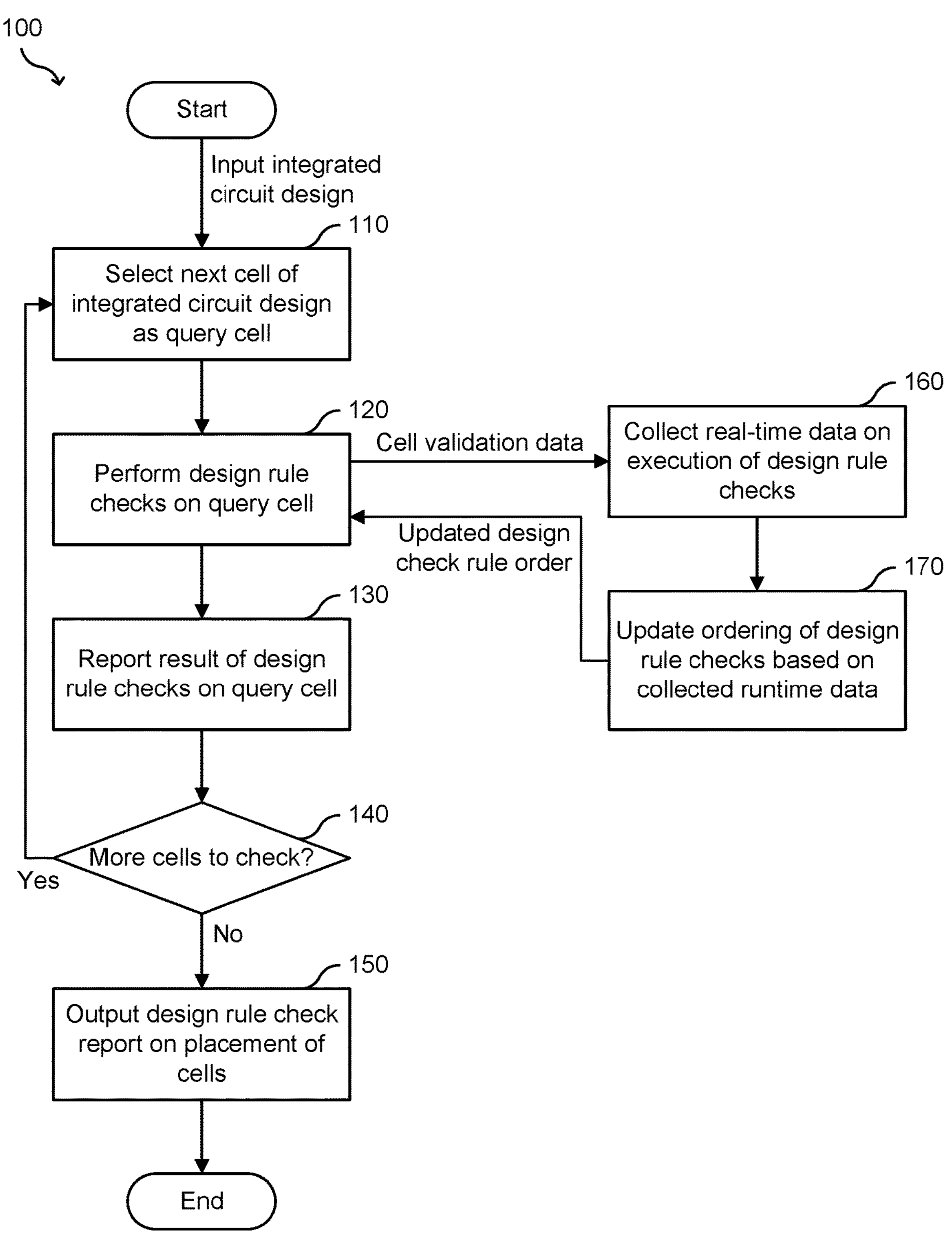
FIG. 1 is a flowchart depicting a method for performing design rule checking with reordering of design rule checkers in accordance with one embodiment of the present disclosure.

Aspects of the present disclosure relate to dynamic ordering of design rule checks.

Design rule checking refers to a process of analyzing a physical layout of an integrated circuit design to detect potential problems in the manufacturability and reliability of an integrated circuit that is fabricated based on the given design. Some of the design rules may be provided by semiconductor manufacturers based on limitations or constraints imposed by the equipment used in their semiconductor fabrication facilities. Examples of design rules include the minimum width of an object (e.g., a metal wire) or a minimum spacing between objects (e.g., between two wires or between two different transistors). Additional examples relate to detecting interactions between different layers, such as ensuring that access from a metal layer to a semiconductor device at the semiconductor layer is not blocked by another metal wire in an intervening metal layer. Individual semiconductor devices (e.g., transistors) may be arranged into components, referred to as cells, that provide specific functionality, such as logic gates that perform logical operations (e.g., Boolean logic operations such as AND, OR, NOT, and XOR) and data storage (e.g., flip-flops and latches). Accordingly, the design rule checks may be applied to an integrated circuit design on a per-cell basis, such as by determining whether the placement of a given cell is valid by determining whether the placement of that cell passes all design rules that are applicable to the integrated circuit design.

As semiconductor manufacturing technologies advance, the minimum sizes of objects (minimum feature sizes) generally shrink such that a manufacturing process generation is often referred to by these minimum feature sizes (e.g., 10 nanometer, 7 nanometer, 5 nanometer, 3 nanometer, 20 angstrom, and the like). These reductions in minimum feature size are also accompanied by increases in the number of metal layers and increased complexity in the potential interactions between different metal layers and the semiconductor devices in the semiconductor layer. For example, manufacturing processes may limit the manners in which metal wiring can be formed precisely in the integrated circuit, such that there are limited valid locations where the semiconductor devices can be placed to connect to signal wiring and/or power and ground wiring.

This increased complexity has led to an increase in the number of design rules that are applied during a design rule check (DRC) as applied to the placement of cells during a cell final placement and optimization stage in the workflow for creating an integrated circuit design. This increase in number of rules has increased the fraction of the total computing runtime that is consumed by design rule checking. For example, in a survey analyzing the integrated circuit design workflows of over 100 integrated circuit designs from a variety of different users (e.g., different companies) showed that placement rule checking specifically related to design rules for more advanced semiconductor manufacturing technologies showed that, in integrated circuit designs targeting a 7 nanometer (N7) manufacturing process, less than 10% of the runtime during final placement and optimization was consumed by DRC. For integrated circuit designs targeting a more advanced 5 nanometer (N5) manufacturing process, less than about 20% of the runtime was consumed by DRC. However, for some integrated circuit designs targeting a still more advanced 3 nanometer (N3) manufacturing process, design rule checking consumed 20% to 90% of the total runtime. In one example, an N3 design spent 90% of its runtime (118 hours out of 131 hours) in advanced design rule checking during a final placement and optimization stage.

The increased runtime in more advanced semiconductor manufacturing technologies relates to additional design rules (referred to herein as advanced design rules) that cause more of the possible placements or positions of a given cell to be invalid (or illegal). Therefore, the final placement and optimization stage must spend more time searching for legal positions to place these cells in the integrated circuit design (e.g., locations in the plane of the flat semiconductor). Disabling the checking of these advanced design rules may result in a resulting integrated circuit that works poorly (e.g., only at low speeds) or that is inoperable, thereby decreasing the quality of result (QoR) of an integrated circuit produced by such a workflow.

Accordingly, aspects of embodiments of the present disclosure relate to reducing the runtime associated with design rule checking while maintaining the quality of result of the integrated circuit design workflow (e.g., ensuring that the design rule checks continue to detect problematic placements of cells in the integrated circuit design such that an integrated circuit fabricated based on the design can be manufactured with high yield and with high performance). In more detail, some aspects of embodiments of the present disclosure relate to dynamically reordering the design rules that are checked based on a predicted likelihood that the cell will fail the design rules. A design rule checker will check design rules in sequence (e.g., one at a time) in order. Because the placement of cell must pass all design rules in order to be confirmed as a valid or legal position, checking the design rules that are more likely to fail before design rules that are more likely to pass reduces the overall runtime (e.g., by reducing the frequency with which the DRC process spends computational time checking design rules that will pass, only to find that the placement of the cell fails due to a rule that is evaluated later on in the process).

Technical advantages of the present disclosure include, but are not limited to, improving the performance of design rule checking in an electronic design automation system for designing integrated circuits. In more detail, by reducing the runtime of performing design rule checking on integrated circuit designs, the quality of the resulting integrated circuits is improved in comparison to integrated circuits where a complete check of all design rules was performed. In addition, shorter runtimes for the design rule checking enables more placements of cells to be explored within a budgeted time for performing this placement and optimization stage. This, in turn, may result in finding a higher quality placement of cells (e.g., able to run at a higher clock speed or with better stability), thereby also improving the quality of the resulting integrated circuit fabricated based on this higher quality placement of the cells.

Aspects of embodiments of the present disclosure will be described in the context of design rule checks performed on the placement of cells of an integrated circuit design into a physical layout. As noted above, placement refers to assigning individual circuit components or cells of an integrated circuit design to specific positions on the chip. Any given placement of a cell (e.g., any given assignment of a cell to a specific position) may pass all the design rules (and thus be a valid placement of that cell) or may fail one or more of the design rules (and thus be an invalid placement of that cell). The design rules may be organized into multiple rule engines or rule checkers, where the rules are grouped based on, for example, relating to similar design constraints and/or rules defined in accordance with different equipment in a target fabrication facility (e.g., a rule engine for power constraints, another rule engine for timing constraints, and other rule engines for constraints imposed by the fabrication equipment, such as minimum spacing imposed by lithographic equipment or metal deposition equipment). Embodiments of the present disclosure are not limited to reordering groupings of design rules and may also be applied to reordering individual design rules. As used herein, a design rule check engine or a design rule checker may refer to a groups of design rules or may refer to an individual design rule.

FIG. 1 is a flowchart depicting a method 100 for performing design rule checking with reordering of the design rules in accordance with one embodiment of the present disclosure. The flowchart of FIG. 1 illustrates a workflow 100 of a design planning stage 110 that include operations or sub-stages for a flat design or non-hierarchical design (e.g., a circuit design where circuit blocks are not arranged by hierarchical level). As shown in FIG. 1, an input integrated circuit design includes a plurality of cells (e.g., circuit cells from a standard-cell library, which may also be referred to as standard cells) and their corresponding placements within the integrated circuit design. The placements of the cells may have been computed during a physical implementation stage 724 of a workflow for designing an integrated circuit (e.g., as described in more detail below with respect to FIG. 7) and/or analysis and extraction stage 726. The design rule checking performed with respect to method 100 may be performed, for example, as a part of a physical verification stage 728 (to verify that the determined placements or physical positions of each of the cells is valid) and/or during the physical implementation stage 724 and/or the analysis and extraction stage 726 (e.g., to determine whether the current choice of placement for the cell is valid before proceeding to placement of another cell).

In various embodiments of the present disclosure, the various stages of the flowchart may be performed using a computer system, such as the computer system described below with respect to FIG. 8. The example embodiment shown in FIG. 1 may be performed in a single-threaded manner (e.g., where design rule checks are performed on the cells of the integrated circuit design one at a time) or may be performed concurrently in a multi-threaded manner (e.g., where design rule checks are performed on the cells of the integrated circuit design more than one cell at a time, such as by different execution threads running on the same processor cores and/or different processor cores, where the processor cores may be in a same central processing unit or in different central processing units in the same computer or in multiple different computers). Various embodiments of the present disclosure will be described herein as being performed by a processor or a processing device without limitation to being performed on a single processor core or being performed in a single-threaded, but instead including implementations in which the computations of the methods are distributed across multiple threads running on one or more processor cores.

In the example embodiment shown in FIG. 1, at 110, the processor selects a next cell of an input integrated circuit design as a query cell. (For example, in a multi-threaded approach, a pool of tasks may be available for consumption by worker threads, where each task corresponds to one or more cells of the integrated circuit design and a worker thread is assigned a task to perform design rule checks on the one or more cells referenced by the task. In a single-threaded approach, a single processing core may iterate through the cells of the integrated circuit design to perform design rule checks on each cell.)

As noted above, the cells of the integrated circuit design have placements within a layout or floorplan of the integrated circuit design, such that the selected next cell is associated with a placement. At 120, the processor performs design rule checks on the placement of the selected cell of the integrated circuit design.

Figure 2A:
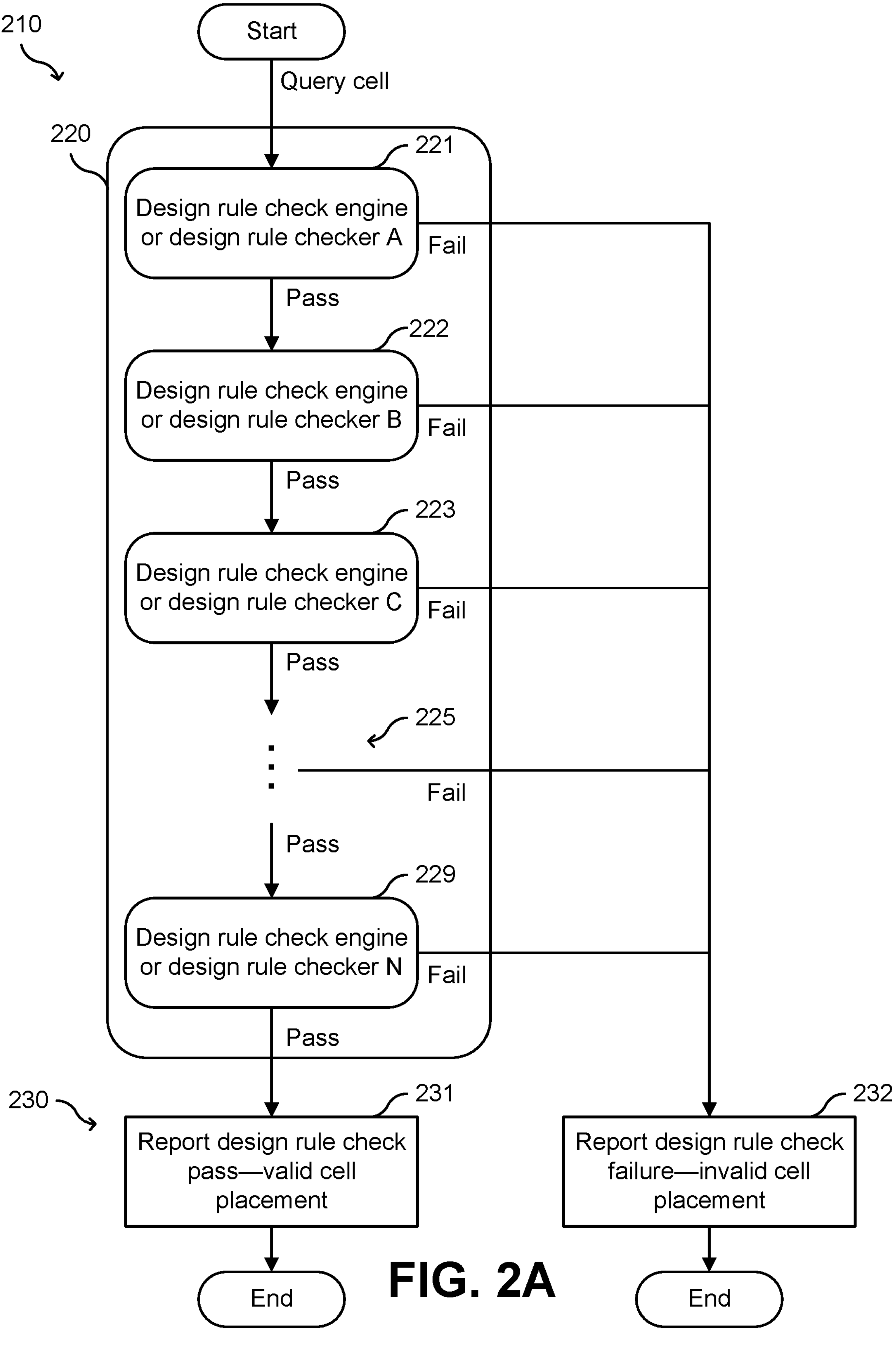
FIG. 2A illustrates performing design rule checks on a query cell based on an initial ordering of design rules and FIG. 2B illustrates a reordering of design rule checkers based on failure frequency in accordance with one embodiment of the present disclosure.

As discussed above, the design rules may be organized into design rule checkers or design rule check engines. FIG. 2A includes a flowchart 210 performing design rule checks on a query cell based on an initial ordering of design rule checkers 220. As shown in FIG. 2A, the design rule checkers 220 are organized into multiple design rule check engines or design rule checkers, shown here as N different design rule check engines or design rule checkers. In more detail, FIG. 2A shows design rule check engine or design rule checker A 221, design rule check engine or design rule checker B 222, design rule check engine or design rule checker C 223, additional design rule check engines or design rule checkers 225, and design rule check engine or design rule checker N 229.

The processor evaluates each design rule check engine or design rule checker in sequence based on an order (e.g., a specified order). When an input query cell passes all of the rules of a design rule check engine or design rule checker, the processor proceeds with applying the next design rule check engine or design rule checker to the query cell in the order. In the example of FIG. 2A, the design rule check engines are placed in an ordered sequence having order: A, B, C, others, and N. On the other hand, in a case where a design rule check engine or design rule checker reports a failure for the input query cell, the remaining design rule check engines in the ordered sequence are ignored (e.g., short circuited) because this design rule check engine has already been determined that the placement of the query cell is invalid.

As such, at 230, the processor reports the result of the design rule check. In a case where all of the design rule check engines or design rule checkers indicate that the placement of the query cell passes the design rules, then the processor reports at 231 that the design rules checks have passed and that the placement of the query cell is valid. On the other hand, in a case where any one of the design rule check engines or design rule checkers indicates that the placement of the query cell has failed, then the processor reports at 232 that the design rule check has failed—that the placement of the query cell is invalid. In other words, the design rule checking process returns early (or breaks early or exits early) at the first design rule check engine or design rule checker that returns a result of "fail" or "no."

Aspects of embodiments of the present disclosure relate to dynamically reordering the sequence of design rule check engines or design rule checkers 220 to reduce the overall runtime of performing design rule checks. As noted above and as shown in FIG. 2A, the design rule checking process returns early at the first design rule check engine or design rule checker that reports a failure, thereby saving the time of executing the design rule check engines or design rule checkers that follow it in the sequence. Reordering the design rule check engines or design rule checkers can reduce the runtime by, on average, reducing the number of passing design rule check engines or design rule checkers that are executed prior to encountering a failure.

Figure 2B:
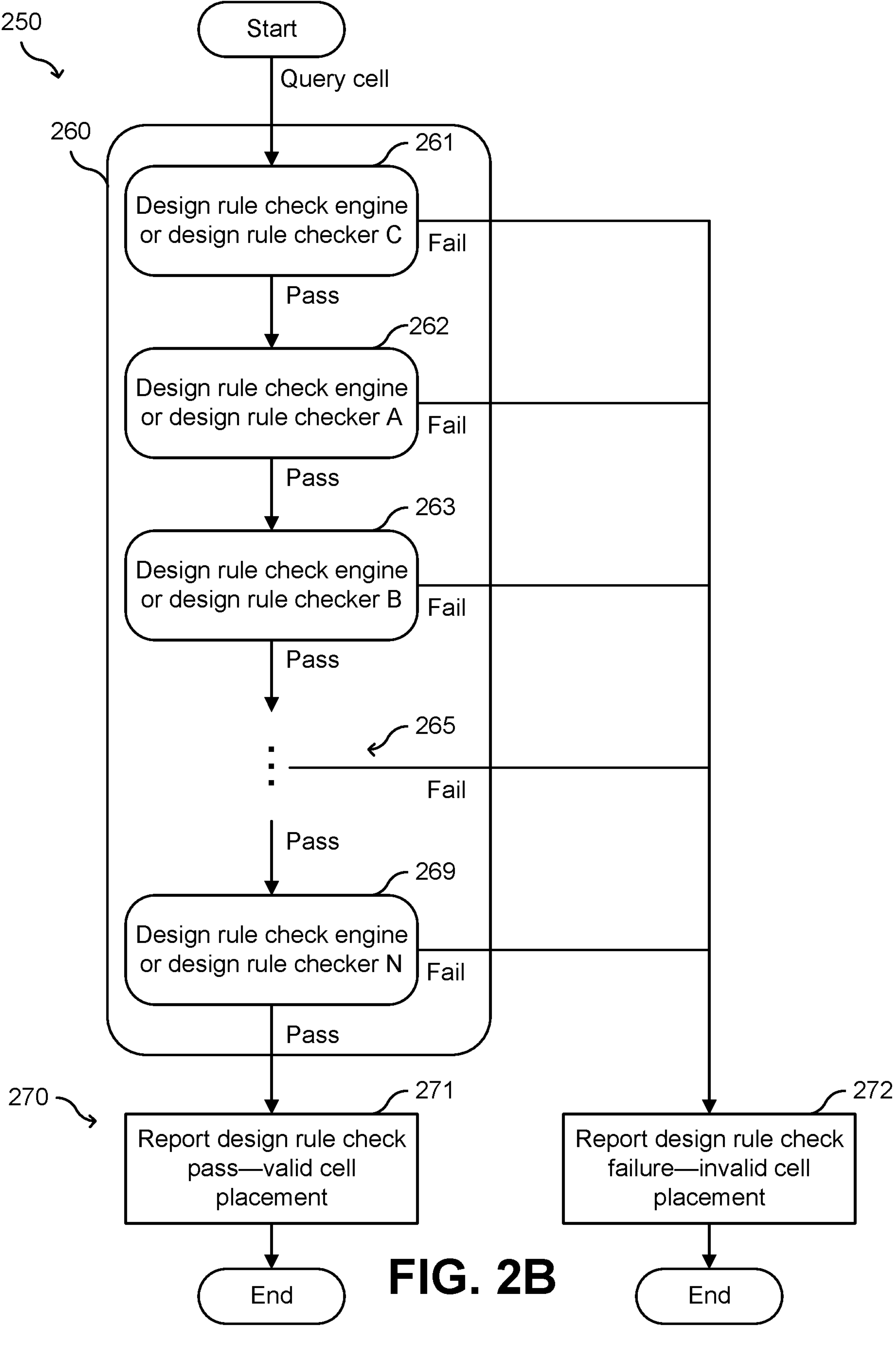

FIG. 2B illustrates reordering design rule checkers (e.g., design rule engines) based on failure frequency in accordance with one embodiment of the present disclosure. As shown in FIG. 2B, the method 250 for performing design rule checking on an input query cell is similar to that shown in FIG. 2A, where the design rules 260 are organized into multiple design rule check engines or design rule checkers, shown here as N different design rule check engines or design rule checkers. However, the arrangement of FIG. 2B shows that the design rule check engines or design rule checkers are placed into a different ordered sequence than that of the design rule check engines or design rule checkers 220 shown in FIG. 2A. In more detail, FIG. 2B shows design rule check engine or design rule checker C 261, followed by design rule check engine or design rule checker A 262 and design rule check engine or design rule checker C 263, additional design rule check engines or design rule checkers 265, and design rule check engine or design rule checker N 269.

At 270, the processor reports the result of the design rule check on the input query cell. In a case where the query cell passed all of the design rules 260, then at 271 the processor reports a design rule check pass (that the query cell has a valid placement). In a case where any one of the design rules 260 fails (e.g., where any one of the design rule check engines or design rule checkers reports a failure or invalid placement), then the design rule check process returns early or breaks early or exits early (thereby skipping over the remaining design rule check engines or design rule checkers) and, at 272, reporting a design rule check failure (that the query cell has an invalid placement).

Referring back to FIG. 1, as noted above, at 130 the processor reports the result of the design rule check on the query cell. This may include, for example, writing the result of the design rule check to memory (e.g., dynamic memory or persistent memory) in the course of recording which of the placements of the cells of the integrated circuit design are valid and which placements are invalid. At 140, the processor determines if there are more cells to check (e.g., more tasks in the task pool or more cells in the list of cells associated with the integrated circuit design). If so, then the processor returns to 110 to select a next cell of the integrated circuit design as a query cell and continues the design rule checking process. After completing the design rule checks, the processor 150 reports the results of the design rule checks regarding the validity of the placements of the cells in the integrated circuit design. The report may then be used to evaluate whether the current design can proceed in the workflow for designing the integrated circuit or whether the layout of the cells needs to be redesigned.

Reordering the design rule check engines or design rule checkers can improve the runtime of the design rule checking process. As one example, suppose that 16 million queries are performed (e.g., regarding the placements of 16 million cells of an integrated circuit design), and supplied to a sequence of three design rule check engines or design rule checkers, referred to herein as design rule checker A, design rule checker B, and design rule checker C. Suppose also that 12 million of those 16 million queries regarding cell placements will return No (or Fail or Invalid) because one of the design rule check engines will report the placement of the cell as invalid. For the purposes of discussion, suppose that 1 million of those failures arise because design rule checker A reports it is an invalid placement, 1 million of those failures arise because design rule checker B reports it is an invalid placement, and 10 million of those failures arise because design rule checker C reports it is an invalid placement.

Assuming that the design rule checks are performed in the order of design rule checker A, then design rule checker B, and then design rule checker C, Table 1 below shows the number of total design rule checks (across all of three of the design rule checkers) that are applied for the 12 million queries that fail.

TABLE 1

| number of rule checks performed for 12 million queries that fail an ordered sequence of design rule checkers | | |
|---|---|---|
| number of checks for one query | number of times returning Fail | Total number of checks |
| 1 (A: Fail) | 1 million | 1 million |
| 2 (A: Pass + B: Fail) | 1 million | 2 million |
| 3 (A: Pass + B: Pass + C: Fail) | 10 million | 30 million |
| | Total: | 33 million |

Referring to Table 1, above, for the 1 million query cells that will be failed by design rule checker A, the design rule checking process for those query cells will terminate immediately after running design rule checker A, such that 1 million total design rule checks are performed for those 1 million query cells (making a simplifying assumption that each design rule checker performs only one design rule check).

For the 1 million query cells that will be failed by design rule checker B, we assume that these 1 million query cells are only checked by design rule checker B because they all passed design rule checker A. However, the checks for both design rule checker A and design rule checker B are performed, two design rule checks are performed for each of these query cells, resulting in a total of 2 million design rule checks performed for this set of 1 million query cells.

For the 10 million query cells that will be failed by design rule checker C, in a similar manner all of these cells passed design rule checker A and design rule checker C. Because three rule checks are performed for each of these cells, a total of 30 million checks are performed for these 10 million query cells.

This means that the 12 million failing query cells required 33 million design rule checks (1 million+2 million+30 million). (The remaining 4 million query cells that have valid placements among the 16 million total query cells will always need to pass all three design rule checkers.)

If the sequence in which the rule engines are reordered, for example, based on failure frequency to move rule engine C to the first position as shown in FIG. 2A (such that the reordered sequence is design rule checker C, then design rule checker A, then design rule checker B), the total number of total checks is reduced from 33 million to 15 million so that less than half as many checks were performed to find the same result (e.g., that 12 million of the query cells have invalid placements).

TABLE 2 number of rule checks performed for 12 million queries that fail a design rule check in a reordered sequence of design rule checkers

| number of checks for one query | number of times returning Fail | Total number of checks |
|---|---|---|
| 1 (C: Fail) | 10 million | 10 million |
| 2 (C: Pass + A: Fail) | 1 million | 2 million |
| 3 (C: Pass + A: Pass + B: Fail) | 1 million | 3 million |
| | Total: | 15 million |

Referring to Table 2, above, for the 10 million query cells that will be failed by check checker C, the design rule checking process for those query cells will terminate immediately after running design rule checker C, such that 10 million total design rule checks are performed for those 10 million query cells (again making a simplifying assumption that each design rule checker performs only one design rule check).

For the 1 million query cells that will be failed by design rule checker A, we assume that these 1 million query cells are only checked by design rule checker A because they all passed design rule checker C (which appears first in the reordered sequence of design rule checkers). However, because the checks for both design rule checker C and design rule checker A are performed, two design rule checks are performed for each of these query cells, resulting in a total of 2 million design rule checks performed for this set of 1 million query cells.

For the 1 million query cells that will be failed by design rule checker B, in a similar manner all of these cells passed design rule checker C and design rule checker A. Because three rule checks are performed for each of these cells, a total of 3 million checks are performed for these 1 million query cells.

This means that the 12 million failing query cells required only 15 million design rule checks using the reordered sequence of design rule checkers. (The remaining 4 million query cells that have valid placements among the 16 million total query cells will always need to pass all three design rule checkers.)

Accordingly, aspects of embodiments of the present disclosure relate to dynamically updating the order in which the design rule checks are performed to improve (reduce) the runtime of performing design rule checks. As noted above, one way to reduce overall runtime is to ensure that design rule check engines or design rule checkers that are more likely to Fail a given query cell earlier on in the ordered sequence of design rule check engines or design rule checkers, while moving the design rule check engines or design rule checkers that are more likely to Pass to the end of the ordered sequence. However, different integrated circuit designs may exhibit different placement problems such the likelihood that a given design rule check engine or design rule checker will determine that a placement is invalid will differ from one integrated circuit design to the next. For example, the likelihood that various design rules will be violated may depend on factors such as the targeted technology node for fabricating the integrated circuit design (e.g., 7 nanometer versus 5 nanometer technology nodes), standard cell libraries that are used in the integrated circuit design, and design blocks with power-ground shapes. Therefore, there is no single rule order that will be good for all fabrication technology nodes, all standard cell libraries, and all integrated circuit designs.

Therefore, one aspect of embodiments of the present disclosure relates to automatically collecting cell validation data (e.g., in real-time) at 160 regarding the execution of design rule checks on query cells. In particular, the processor captures numerous iterations of the loop reporting successful (passing) and failed physical design rule checks from each design rule check engine or design rule checker, frequency of failure (failure rate) and the runtime (e.g., real-world clock time or computer processor time) of running the design rule check engine or design rule checker. For example, the cell validation data includes the results of the reported design rule check passes (231 and/or 271) and the reported design rule check failures (232 and/or 272).

The collected real-time cell validation data can then be used by the processor, at 170, to automatically adjust or update the ordered sequence of design rule check engines or design rule checkers based on the collected data. In various embodiments of the present disclosure, the processor updates the order of the sequence of design rule check engines or design rule checkers periodically (e.g., based on a schedule). For example, the period of updates may be controlled by the number of cells checked (e.g., update the sequence once every 1,000 cells, once every 10,000 cell, once every 100,000 cells, or once every 1,000,000 cells) or may be set based on elapsed real-world time (e.g., update the sequence once every 30 minutes or once every hour of real-world runtime).

In more detail, some aspects of embodiments of the present disclosure relate to reordering the design rule check engines or design rule checkers based on failure frequency. Each time a query cell is supplied to the sequence of design rule checks, the processor tracks the output of each design rule check engine or design rule checker, such as by tracking a total number of checks performed and the number of times the design rule check engine or design rule checker returned a fail result for the query cell. For each such design rule check engine or design rule checker, the running number of fail results divided by the total number of checks performed by the design rule check engine or design rule checker gives a failure rate or failure frequency (e.g., as a percentage) for that design rule check engine or design rule checker. Due to the early return behavior in which later design rule check engines or design rule checkers are not executed if an earlier design rule check engine or design rule checker reported a Fail (finding the placement of the query cell to be invalid), the processor will collect less data on design rule check engines or design rule checkers that appear later in the sequence of design rule checks than those that appear earlier in the sequence. Accordingly, the failure rates are tracked and computed on a per-design rule check engine or per-design rule checker basis.

Figure 3:
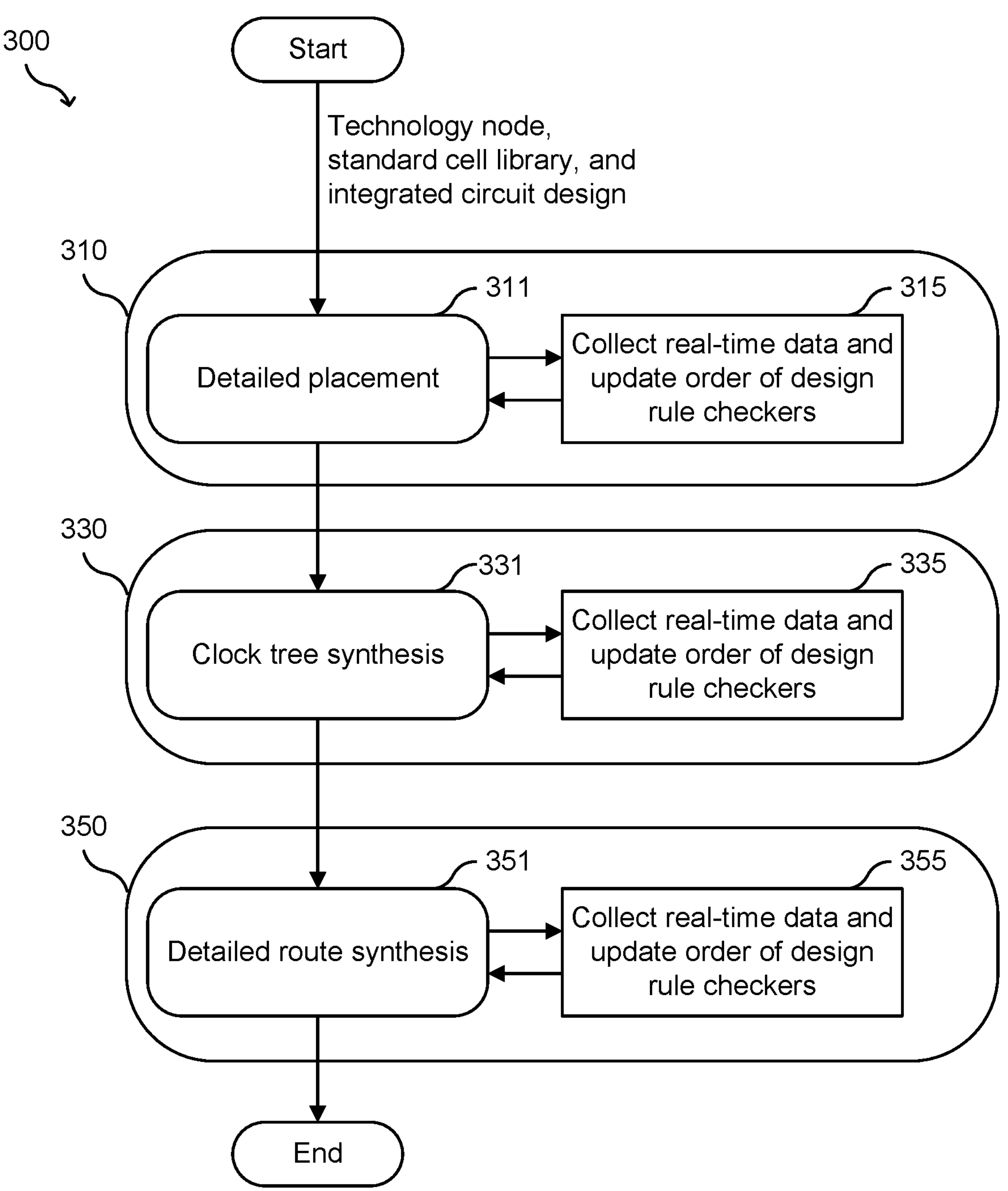
FIG. 3 illustrates real-time data collection of design rule checking behavior, at different stages of a physical implementation portion of a workflow for designing an integrated circuit, for dynamically reordering design rules according to one embodiment of the present disclosure.

The failure rates for different design rule check engines or design rule checkers may also vary based on the stage of the integrated circuit design workflow in which the design rule checks are run. FIG. 3 illustrates real-time cell validation data collection of design rule checking behavior, at different stages of a physical implementation portion 300 of a workflow for designing an integrated circuit, for dynamically reordering design rules according to one embodiment of the present disclosure.

Some of the sub-stages of a physical implementation stage 300 include a detailed placement sub-stage (place_opt) 310, clock tree synthesis sub-stage (clock_opt) 330, and a detailed route synthesis sub-stage (route_opt) 350. When performing detailed placement of cells 311 in the detailed placement sub-stage 310, the processor applies design rule checks to the current placements of cells to determine whether those placements are valid. Similarly, the processor applied design rule checks when performing clock tree synthesis 331 in the clock tree synthesis sub-stage 330 and when performing detailed route synthesis 351 in the detailed route synthesis sub-stage 350. These different sub-stages may perform insertions of cells or sizing of cells that may trigger different types of violations of design rules.

Accordingly, some aspects of embodiments of the present disclosure further relate to performing real-time cell validation data collection and dynamic re-ordering of design rule check engines or design rule checkers during the execution of design rule checking of each of these different stages. As shown in FIG. 3, the processor collects real-time cell validation data regarding the results of performing design rule checks on the cells and periodically updates the order in which the design rule checks are performed based on the collected data (e.g., such that design rule checks that have the highest failure rates are performed earlier in the sequence). Because the failure frequencies of the different design rule check engines or design rule checkers vary between the different sub-stages of the physical implementation stage 300, collection of real-time cell validation data and updating the order of the design rule checks at 315 is performed for detailed placement 311 and is separate from the collection of real-time cell validation data and updating the order of the design rule checks at 335 for clock tree synthesis 331 and is also separate from collection of real-time cell validation data and updating the order of the design rule checks at 355 for detailed route synthesis 351.

In addition to ordering by failure frequency, some aspects of embodiments of the present disclosure further relate to ordering design rule check engines or design rule checkers based on weights corresponding to runtime. For example, two different design rule checkers may have similar failure frequencies, but one of these design rule checkers may have half the runtime of the other, so ordering the design rule checkers such that the faster design rule checker (having a shorter runtime) runs before the slower design rule checker (having a longer runtime) can reduce the overall runtime of performing design rule checks on the cells of the integrated circuit design.

Accordingly, in some embodiments, the ordering metric is computed based on a failure frequency multiplied by a weighted runtime factor for every design rule check engine (e.g., where the weighted runtime factor is computed based on an inverse of the average runtime of the design rule check engine). As noted above, the collection of real-time cell validation data on the execution of the design check rules at 160 of the method 100 shown in FIG. 1 includes the collection of runtime data of running the design rule check engine or design rule checker. Tracking the runtimes of these design rule check engines across many executions on cells of the integrated circuit designs allows computation of corresponding average runtimes (e.g., mean runtime or median runtime), which can then be used to compute the weighted runtime factor. These runtime factors computed based on runtime information from previous runs is referred to herein as an absolute runtime factor.

In some circumstances runtime information of previous runs is not available (e.g., early in the execution of the design rule check process). In some embodiments, the processor derives relative runtime factors from average runtime information provided by the developers and/or maintainers of the design rule check engines (e.g., average runtime information collected across all executions on all designs, not tailored to the specific design or stage of the integrated circuit design workflow).

Therefore, runtime-weighted design rule ordering can reduce the runtime of performing design rule checks even if some design rule check engines have similar failure frequencies by setting the order of the design rule check engines based on their different execution speeds.

Some aspects of embodiments of the present disclosure further relate to tailoring the order of design rule check engines or design rule checkers on a per-cell basis based on features of the cell and features of the environment in which the cell is located within the layout of the integrated circuit design. For a given design rule check engine, some cells in some specific environments may have higher failure rates than other cells in those specific environments. In addition, some cells may have similar failure rates in different environments.

Accordingly, some aspects of embodiments of the present disclosure relate to classifying a given query cell into one of a plurality of categories based on features of the cell and features of its current environment within the integrated circuit design. Each such category then corresponds to an ordering of the design rule check engines or design rule checkers that is tailored based on the behavior of that category of cells to reduce or minimize the runtime of performing design rule checking on that category of cells (e.g., ordered from highest failure rate to lowest failure rate, optionally weighted by runtime, for the corresponding category of cells).

Examples of features of the cell include, but are not limited to: the size of the cell (e.g., width and height); the number of pins on the cell; and the accessibility of those pins. Examples of features of the environment of the cell within the layout of the design include: density of cells in the region (or local neighborhood) in which the cell is placed; density of connections or metal in the region in which the cell is placed; density of power and ground rails (e.g., reachability of power and ground rails); and blockages with respect to access between pins and metal layers carrying signals. In some embodiments, a region or local neighborhood of the cell refers to all cells directly adjacent or abutting the query cell (e.g., in a vertical direction or horizontal direction) and cells having corners that touch a corner of the query cell.

Figure 4:
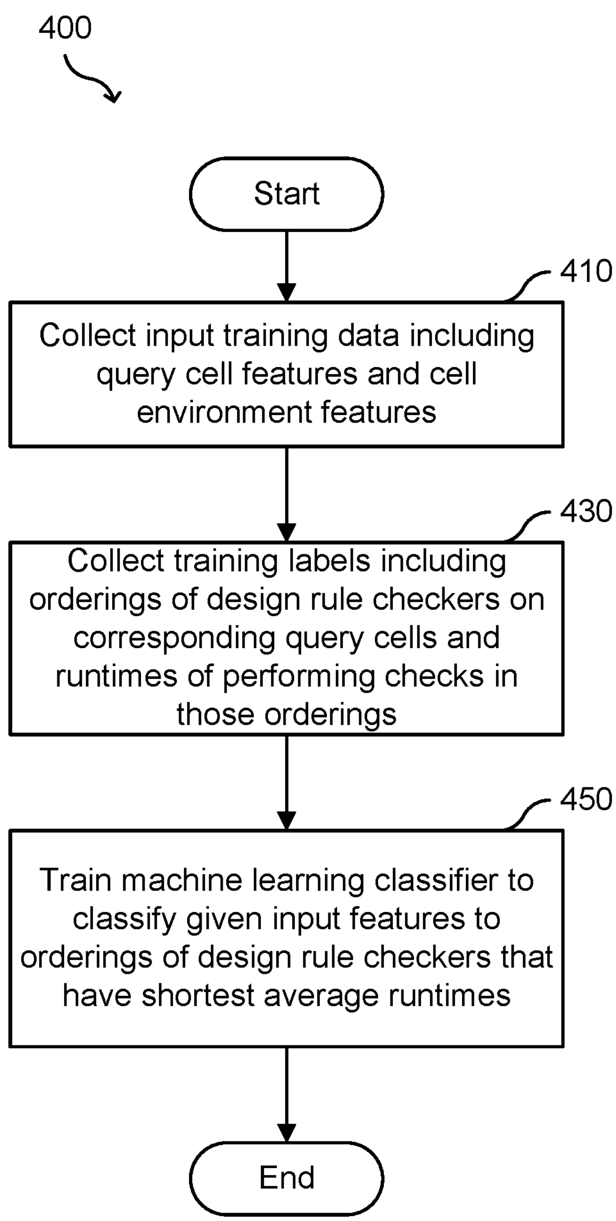
FIG. 4 is a flowchart of a method for training a machine learning model to select an ordering of design rule checks based on cell features and cell environment features according to one embodiment of the present disclosure.

In some embodiments of the present disclosure, the categorization is performed using a trained classifier machine learning model such as a neural network, generative adversarial network, a convolutional neural network (e.g., by converting a cell environment into an image and training the convolutional neural network to classify the image into groups), or gradient tree (e.g., XGBoost). FIG. 4 is a flowchart of a method 400 for training a machine learning model to select an ordering of design rule checks based on cell features and cell environment features according to one embodiment of the present disclosure. For example, at 410, a computer system configured to train the machine learning model collects input training data including the features of query cells and the environments of those query cells, and, at 430, the computer system collects corresponding training labels that include the ordering of the design rule check engines (or design rule checkers) and the actual runtime of performing those design rule checks on those corresponding cells in that order. These collected data may then be used, at 450, to train a machine learning classifier (e.g., a neural network or a gradient boosted tree) to classify the query cells based on their features and the features of their environments and to map the output classes to corresponding orderings of the design rule check engines (or design rule checkers) that have the shortest runtimes.

Figure 5:
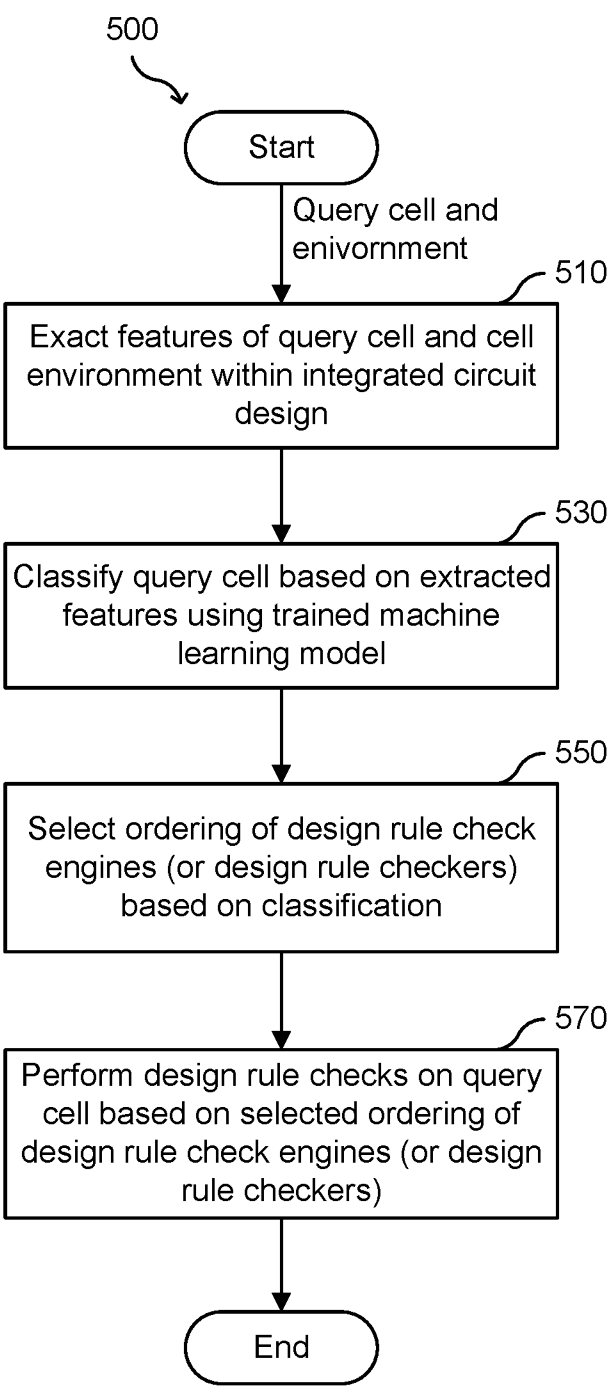
FIG. 5 is a flowchart depicting a method for using a trained machine learning model to select an ordering of the design rule checkers for a given query cell and to execute the design rule checks based on that ordering according to one embodiment of the present disclosure.

FIG. 5 is a flowchart depicting a method 500 for using a trained machine learning model to select an ordering of the design rule checkers for a given query cell and to execute the design rule checks based on that ordering according to one embodiment of the present disclosure. At 510, the processor extracts features of a query cell and features of the cell environment of the query cell within the integrated circuit design. The features extracted at 510 correspond to the features that were extracted during the training process (e.g., cell features including cell size, number of pins, and the like and environment features of the cell including density of region around the cell, power and ground rail density, and the like).

At 530, the processor supplies the extracted features to the trained machine learning model to classify the query cell based on the extracted features. At 550, the processor selects an ordering of the design rule check engines based on the classification of the query cell (e.g., each possible classification of the query cell is associated with a corresponding ordering of the design rule check engines, where the ordering was selected during the training process based on the order that had the shortest runtime for cells in that class). At 570, the processor performs the design rule checks on the query cell based on the selected ordering of the design rule check engines (or design rule checkers).

In some embodiments, the machine learning model is used to set the initial order of the design rule check engines or the design rule checkers. In some embodiments, the initial order of the design rule check engines is set on a per-class basis (e.g., for each class of cells as determined by the machine learning model) and this initial ordering for each class of query cells is updated as discussed above with respect to FIG. 1 (e.g., the ordering is adjusted based on a real-time failure rate, as performed on a per-class basis for the classifications of the query cells).

In some embodiments, the initial order of the design rule checkers (e.g., prior to dynamic reordering at 170) is set based on average runtimes of the design rule check engine or design rule checker (e.g., from fastest to slowest).

While aspects of embodiments of the present disclosure were presented above with respect to dynamically altering the order in which design rule check engines or design rule checkers were applied to a query cell during a design rule checking process, embodiments of the present disclosure are not limited to reordering at the level of design rule check engines or design rule checkers. For example, a given design rule check engine or design rule checker may include a plurality of scenarios corresponding to different scenarios that evaluate to whether the design rule passes or fails, and the ordering of scenarios within a design rule check engine or design rule checker may also be reordered to shorten runtimes to place the scenarios with highest hit rate earlier in the ordering of scenarios based on characteristics of the input design.

Figure 6:
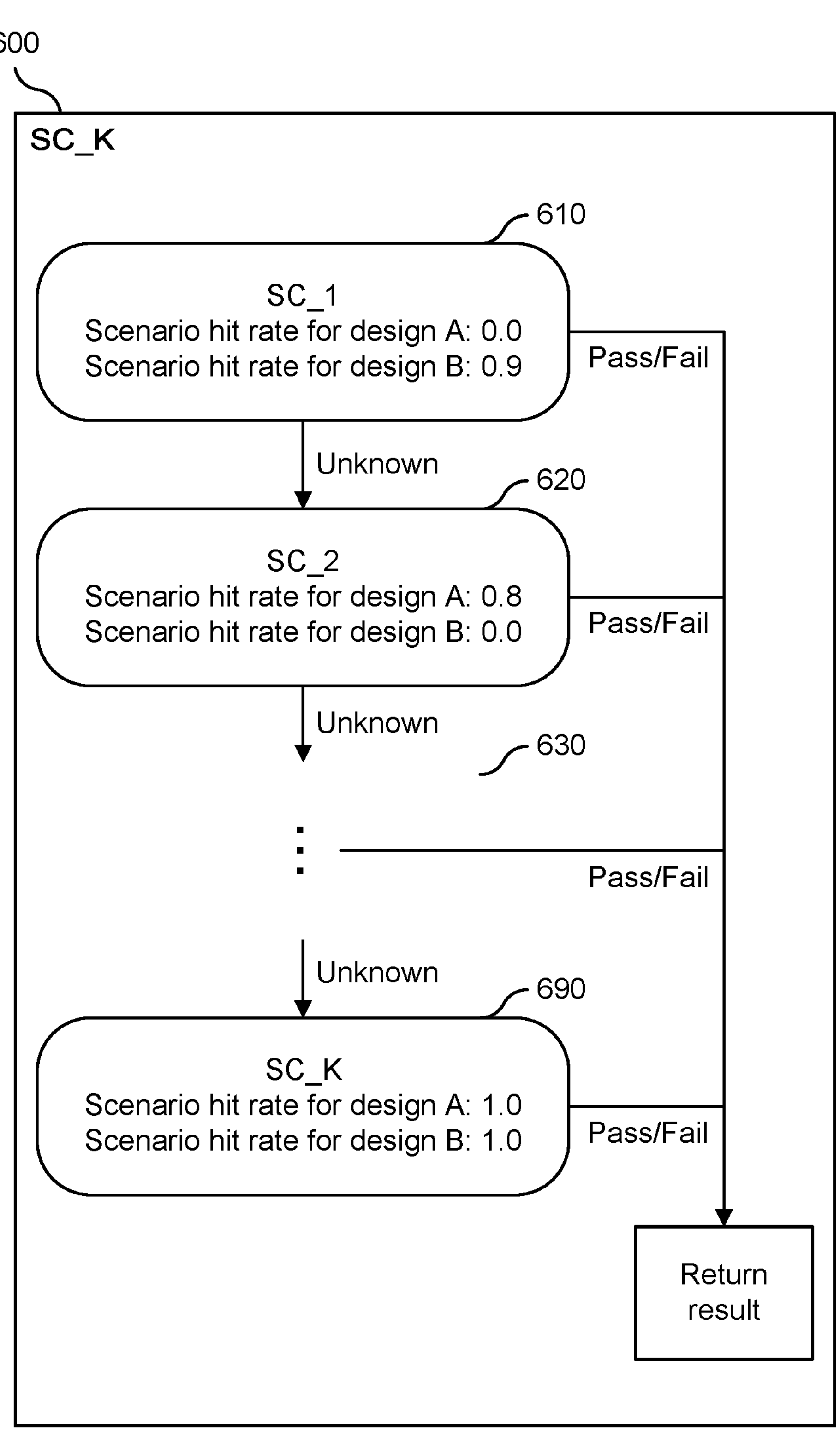
FIG. 6 illustrates the division of a design rule checker into scenarios or sub-groups and dynamically reordering sub-groups of rules according to one embodiment of the present disclosure.

FIG. 6 illustrates the division of a design rule check engine or design rule checker 600 into scenarios and dynamically reordering the scenarios according to one embodiment of the present disclosure. A given design rule check engine or design rule group may include a scenario checker (SC) configured to check a specific scenario that would trigger violations in this rule check. The scenarios shown in FIG. 1 include a first scenario SC_1 610 and a second scenario SC_2 620. For example, a scenario may relate to a minimum width of a cell (e.g., cell width≥4), and the first scenario SC_1 610 may correspond to a case where the cell width is greater than or equal to 4, where being able to answer one way or the other will generate a pass or a fail response appropriately. However, if the input is insufficient to make the determination (or, depending on the rule, if the input query cell failed to meet the condition), then the flow proceeds to the second scenario SC_2 620 with a different condition (e.g., the cell width is less than 4 and is abutted by diff-VT cells on both sides). The process continues with additional scenarios 630 up until a Kth scenario 690 as shown in FIG. 6, ending early or breaking early when a scenario evaluates to a pass or fail result, at which point the result is returned by the design rule check engine or design rule checker 600.

As noted above, different scenarios may have different hit rates (e.g., where a hit corresponds to a case where a scenario produces a pass result or a fail result instead of an Unknown result that requires checking the next scenario in the sequence).

The scenario checker 600 tracks (e.g., counts) the rate at which each scenario is hit (e.g., for which the design fails the checks associated with the scenario) for various designs (e.g., design A and design B) to compute a hit rate for these different designs. Because different designs encounter different scenarios, even for designs with the same technology node, a general scenario that was applied to all input designs would not minimize maximize the hit rate for every design. However, by reordering the application of scenarios on a per-design basis (e.g., by tracking real-time hit rates and dynamically updating the order to maximize hit rates and/or in accordance with features of the design using a machine learning model), the overall runtime of a given design rule check engine or design rule checker can be improved. This approach also allows additional scenario checkers to be added to a design rule checker or design rule check engine with low impact on runtime (e.g., because the scenarios with high hit rates would still be triggered earlier).

Figure 7:
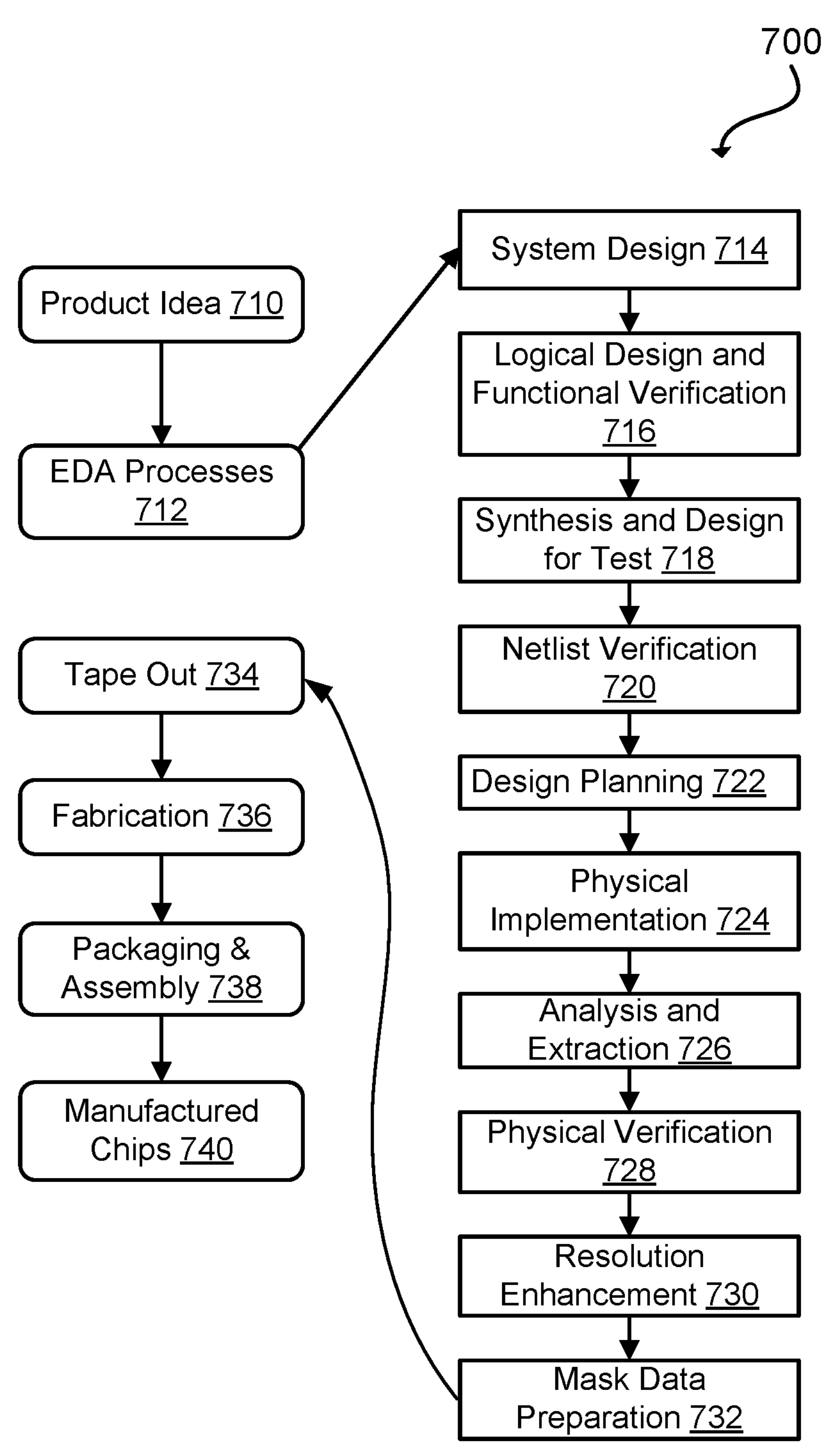
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by FIG. 7 may be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
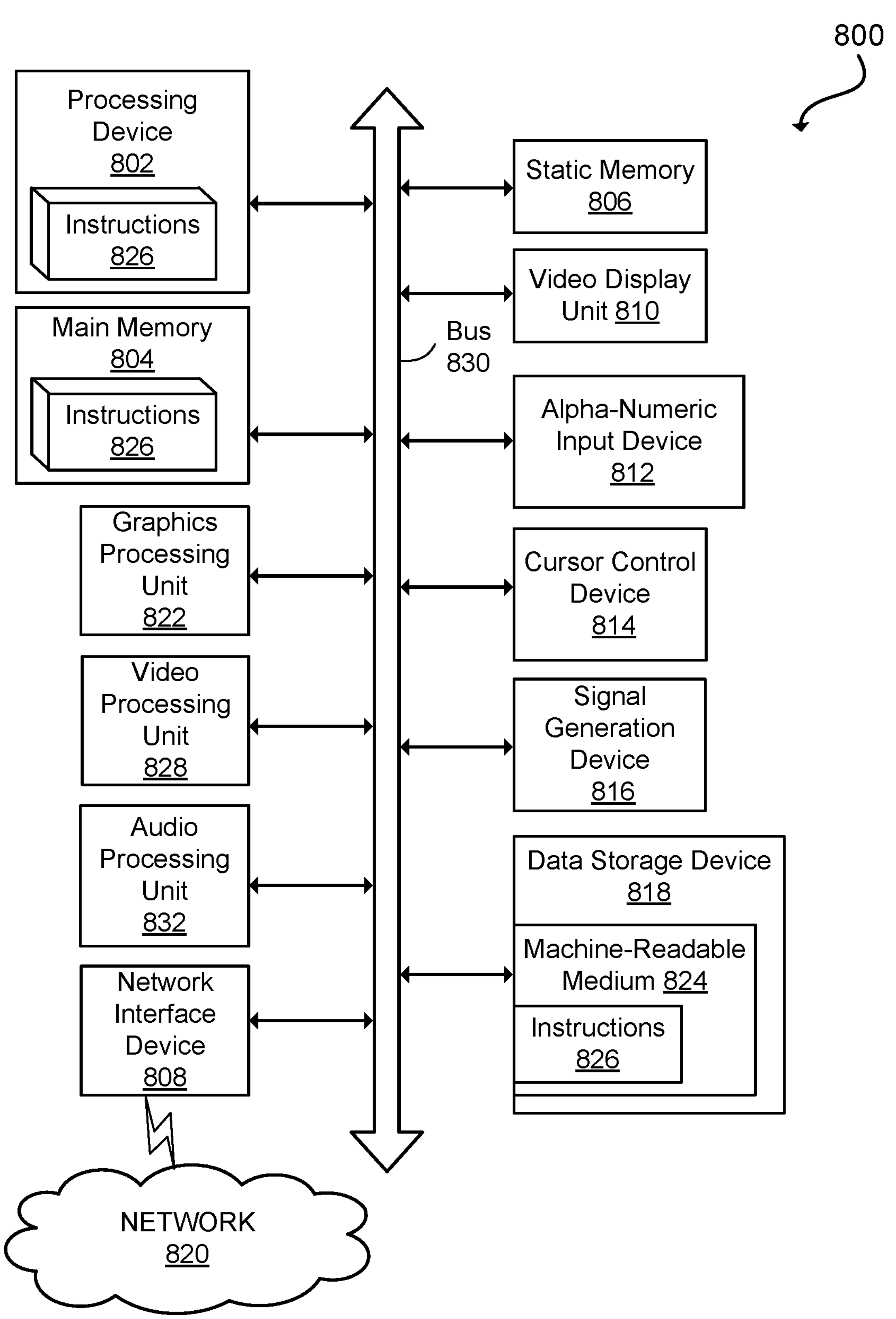
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random-access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer-readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

receiving an integrated circuit design comprising a plurality of cells;

performing a first plurality of design rule checks on a first portion of the plurality of cells of the integrated circuit design based on a sequence of design rule checkers arranged in a first order;

collecting data on an execution of the design rule checkers on the first portion of the plurality of cells;

updating, by a processing device, the sequence of design rule checkers, based on the data, to a second order of design rule checkers; and performing a second plurality of design rule checks on a second portion of the plurality of cells of the integrated circuit design based on the sequence of design rule checkers arranged in the second order.

2. The method of claim 1, wherein the data comprises a failure count for a design rule checker of the design rule checkers, the failure count corresponding to a count of times the design rule checker has reported that a cell has violated a design rule of the design rule checker, and wherein the processing device computes the second order of design rule checkers based on a failure frequency of the design rule checker, the failure frequency being computed based on the failure count.

3. The method of claim 2, wherein the processing device further computes the second order of design rule checkers based on weighting the failure frequency by a runtime of the design rule checker.

4. The method of claim 1, further comprising:

collecting second data on the execution of the design rule checkers on the second portion of the plurality of cells;

updating the sequence of design rule checkers, based on the second data, to a third order of design rule checkers; and performing a third plurality of design rule checks on a third potion of the plurality of cells of the integrated circuit design based on the sequence of design rule checkers arranged in the third order.

5. The method of claim 1, wherein the plurality of cells of the integrated circuit design are placed based on a first sub-stage of a physical implementation stage, wherein the method further comprises:

receiving an updated integrated circuit design comprising the plurality of cells placed based on a second sub-stage of the physical implementation stage;

performing a third plurality of design rule checks on a third portion of the plurality of cells of the updated integrated circuit design based on the sequence of design rule checkers arranged in a third order;

collecting second data on the execution of the design rules on the third portion of the plurality of cells;

updating the sequence of design rule checkers based on the second data to a fourth order of design rule checkers; and performing a fourth plurality of design rule checks on a fourth portion of the plurality of cells of the updated integrated circuit design based on the sequence of design rule checkers arranged in the fourth order.

6. The method of claim 1, further comprising:

classifying the first portion of the plurality of cells of the integrated circuit design using a trained machine learning model, wherein the cells of the first portion of the plurality of cells are classified by the trained machine learning model to a first classification and wherein the first order is associated with the first classification;

classifying a third portion of the plurality of cells of the integrated circuit design using the trained machine learning model to a second classification; and performing a third plurality of design rule checks on the third portion of the plurality of cells of the integrated circuit design based on the sequence of design rule checkers arranged in a third order associated with the second classification.

7. The method of claim 1, wherein a design rule checker comprises a plurality of scenarios arranged in an ordered sequence, and wherein the method further comprises:

reordering the scenarios of the design rule checker based on a hit rate of a sicario of the scenarios of the design rule checker.

8. A system comprising:

a memory storing instructions; and a processor, coupled with the memory and to execute the instructions, the instructions when executed cause the processor to:

classify a cell using a machine leaning model based on one or more cell features and one or more environment features of the cell;

selecting an order of design rule checkers based on the classification of the cell; and perform design rule checks on the cell based on the selected order of design rule checkers.

9. The system of claim 8, wherein the cell features comprise one or more of:

a size of the cell;

a width of the cell;

a height of the cell; and a number of pins of the cell.

10. The system of claim 8, wherein the environment features comprise one or more of:

a density of cells in a region containing the cell;

a density of connections in the region containing the cell;

a density of power and ground rails in the region containing the cell; and blockages with respect to access between pins and metal layers in the region containing the cell.

11. The system of claim 8, wherein the processor further executes the instructions to:

collect input training data including cell features and cell environment features;

collect training labels including orderings of design rule checkers on corresponding query cells and runtimes of performing design rule checks; and train a machine learning classifier to classify given input cell features and cell environment features to orderings of design rule checkers.

12. The system of claim 8, wherein the processor further executes the instructions to update the order of the design rule checkers based on a failure frequency to compute a second order of the design rule checkers.

13. The system of claim 12, wherein the processor further computes the second order of design rule checkers based on weighting the failure frequency by an average runtime of the design rule checker.

14. A non-transitory computer-readable medium comprising stored instructions, which when executed by a processor, cause the processor to:

receive an integrated circuit design comprising a plurality of cells;

perform a first plurality of design rule checks on a first portion of the plurality of cells of the integrated circuit design based on a sequence of design rule checkers arranged in a first order;

collect data on the execution of the design rule checkers on the first portion of the plurality of cells;

update, by the processor, the sequence of design rule checkers, based on the data, to a second order of design rule checkers different from the first order; and perform a second plurality of design rule checks on a second portion of the plurality of cells of the integrated circuit design based on the sequence of design rule checkers arranged in the second order.

15. The non-transitory computer-readable medium comprising stored instructions of claim 14, wherein the data comprises a failure count for a design rule checker of the design rule checkers, the failure count corresponding to a count of times the design rule checker has reported that a cell has violated a design rule of the design rule checker, and wherein the non-transitory computer-readable medium further comprises stored instructions that, when executed by the processor, cause the processor to compute the second order of design rule checkers based on a failure frequency of the design rule checker, the failure frequency being computed based on the failure count.

16. The non-transitory computer-readable medium comprising stored instructions of claim 15, wherein the non-transitory computer-readable medium comprising stored instructions further stores instructions to compute the second order of design rule checkers based on weighting the failure frequency by an average runtime of the design rule checker.

17. The non-transitory computer-readable medium comprising stored instructions of claim 14, further storing instructions that, when executed, cause the processor to:

collect second data on the execution of the design rule checkers on the second portion of the plurality of cells;

update the sequence of design rule checkers, based on the second data, to a third order of design rule checkers different from the first order and different from the second order; and perform a third plurality of design rule checks on a third portion of the plurality of cells of the integrated circuit design based on the sequence of design rule checkers arranged in the third order.

18. The non-transitory computer-readable medium comprising stored instructions of claim 14, wherein the plurality of cells of the integrated circuit design are placed based on a first sub-stage of a physical implementation stage, and wherein the non-transitory computer-readable medium comprising stored instructions further stores instructions that, when executed by the processor, cause the processor to receive an updated integrated circuit design comprising the plurality of cells placed based on a second sub-stage of the physical implementation stage;

perform a third plurality of design rule checks on a third portion of the plurality of cells of the updated integrated circuit design based on the sequence of design rule checkers arranged in a third order;

collect second data on the execution of the design rules on the third portion of the plurality of cells;

update the sequence of design rule checkers based on the second data to a fourth order of design rule checkers; and perform a fourth plurality of design rule checks on a fourth portion of the plurality of cells of the updated integrated circuit design based on the sequence of design rule checkers arranged in the fourth order.

19. The non-transitory computer-readable medium comprising stored instructions of claim 14 further comprising instructions that, when executed by the processor, cause the processor to:

classifying the first portion of the plurality of cells of the integrated circuit design using a trained machine learning model, wherein the cells of the first portion of the plurality of cells are classified by the trained machine learning model to a first classification and wherein the first order is associated with the first classification;

classifying a third portion of the plurality of cells of the integrated circuit design using the trained machine learning model to a second classification different from the first classification; and performing a third plurality of design rule checks on the third portion of the plurality of cells of the integrated circuit design based on the sequence of design rule checkers arranged in a third order associated with the second classification.

20. The non-transitory computer-readable medium comprising stored instructions of claim 14, wherein a design rule checker comprises a plurality of scenarios arranged in an ordered sequence, and wherein the non-transitory computer-readable medium further comprises instructions that, when executed by the processor, cause the processor to:

reorder the scenarios of the design rule checker based on a hit rate of a sicario of the scenarios of the design rule checker.

* * * * *